(12) United States Patent
Gutin et al.

(10) Patent No.: US 6,282,213 B1
(45) Date of Patent: Aug. 28, 2001

(54) TUNABLE DIODE LASER WITH FAST DIGITAL LINE SELECTION

(75) Inventors: Mikhail A. Gutin; James Castracane, both of Albany, NY (US)

(73) Assignee: InterScience, Inc., Troy, NY (US)

(*) Notice: Subject to any disclaimer, the term of this patent is extended or adjusted under 35 U.S.C. 154(b) by 0 days.

(21) Appl. No.: 09/152,428

(22) Filed: Sep. 14, 1998

(51) Int. Cl.[7] .................................................. H01S 3/10
(52) U.S. Cl. ................................. 372/20; 372/98; 372/99
(58) Field of Search .................................. 372/20, 98–99

(56) References Cited

U.S. PATENT DOCUMENTS

| | | |
|---|---|---|
| 4,216,439 | 8/1980 | Pond et al. . |
| 4,896,325 | 1/1990 | Coldren . |
| 4,897,843 | 1/1990 | Scott . |
| 4,920,541 | 4/1990 | Baumgartner et al. . |
| 5,230,005 * | 7/1993 | Rubino et al. ............................ 372/20 |
| 5,276,695 | 1/1994 | Scheps . |
| 5,319,668 | 6/1994 | Luecke . |
| 5,524,012 | 6/1996 | Wang et al. . |
| 5,624,437 * | 4/1997 | Freeman et al. ........................ 606/12 |
| 5,734,666 | 3/1998 | Wada et al. . |
| 5,771,252 | 6/1998 | Lang et al. . |

OTHER PUBLICATIONS

M.G. Littman and H.J. Metcalf, "Spectrally Narrow Pulsed Dye Laser Without Beam Expander", Applied Optics, vol. 17, No.14, Jul. 15, 1978, 2224–2227.

P. McNicholl and H.J. Metcalf, "Synchronous Cavity Mode And Feedback Wavelength Scanning in Dye Laser Oscillators with Gratings", Applied Optics, vol. 24, No. 17, Sep. 1, 1985, 2757–2761.

K.C. Harvey and C.J. Myatt, "External–cavity Diode Laser Using a Grazing incidence Diffraction Grating", Optics Letters, vol. 16, No. 12, Jun. 15, 1991, 910–912.

P. Zhongqi, Z. Hanyi, Y. Jinqiang, et al., "Programmable Tuning External Cavity Laser Diode", SPIE Proceedings, vol. 2482, May 1995, 269–274.

Y. Uenishi, K. Akimoto, and S. Nagaoka, "Microelectromechanical Systems (MEMS) and Their Photonic Applications", SPIE Proceedings, vol. 3098, Sep. 1997, 374–381.

* cited by examiner

*Primary Examiner*—Teresa M. Arroyo
*Assistant Examiner*—James Menefee
(74) *Attorney, Agent, or Firm*—Jay R. Yablon; Michelle D. Simkulet

(57) ABSTRACT

An improved tunable diode laser is capable of fast digital line selection over a broad wavelength spectrum, and uses no moving parts. A focusing element, such as a mirror or a lens, used in combination with a micromirror array serves as the retroreflector in a typical Littman-Metcalf laser cavity. This configuration provides arbitrary, simultaneous, and/or sequential line selection capability over a very broad wavelength range. The use of an individually-controllable micromirror array eliminates the high precision mechanical motion of a grating element and improves the overall durability and ruggedness of the device. The present invention can be integrated into any diode laser and has significant application in spectroscopy.

60 Claims, 3 Drawing Sheets

TUNABLE DIODE LASER WITH FAST DIGITAL LINE SELECTION

This invention was made with U.S. Government support under contract #F29601-98-C-0147 awarded by the Department of the United States Air Force. The government has certain rights in the invention.

FIELD OF THE INVENTION

This invention relates to the field of tunable diode lasers, and particularly to tunable diode laser configured as a Littman-Metcalf laser cavity with high speed line selection capability.

BACKGROUND OF THE INVENTION

Tuning for a monochromatic light, such as emission from a laser diode, is most commonly realized by using the Littman-Metcalf external cavity configuration with a diffraction grating and a rotating mirror used to select the specific wavelength. Using this approach, a high degree of precision in the rotation mechanism is required for wavelength selection, and the tuning process is very slow. This original approach as applied to dye laser technology is described in detail in the following non-patent prior art: M. G. Littman and H. J. Metcalf, Applied Optics, vol. 17, no. 14, 2224–2227, Jul. 15, 1978, and P. McNicholl and H. J. Metcalf, Applied Optics, vol. 24, no. 17, 2757–2761, Sep. 1, 1985.

Recently, a variety of techniques have been applied to tuning diode lasers. Versatility and low cost are desired specifically in spectroscopic applications. For example, a variety of U.S. Patents exist for laser tuning with alternative configurations of the mirror at the cavity end. U.S. Pat. No. 4,896,325 discloses an alternative cavity configuration in which a pair of mirrors with narrow discontinuities to provide reflective maxima bound the active cavity. These narrow bands of reflective maxima provides means for wavelength tuning which is actively controlled by a vernier circuit. U.S. Pat. No. 4,920,541 discloses an external laser cavity configuration of multiple resonator mirrors used to produce multiple wavelength emission from a single laser cavity simultaneously or with a very fast switching time. U.S. Pat. No. 5,319,668 discloses a tunable diode laser with a diffraction grating for wavelength separation and a moveable mirror at the cavity end for wavelength selection. The pivot points are designed to provide an internal cavity length specific for the production of several wavelengths. Alternative tuning arrangements are possible. U.S. Pat. No. 5,771,252 discloses an external cavity continuously tunable wavelength source utilizing a cavity end reflector moveable about a pivot point for simultaneous rotation and translation for wavelength selection.

In addition, several U.S. Patents disclose the use of alternative components in the laser cavity configuration in order to achieve wavelength tuning. U.S. Pat. No. 4,216,439 discloses a spectral line selection technique that utilizes a spectral line selection medium in the gain region of an unstable laser resonator cavity. U.S. Pat. No. 4,897,843 discloses a microprocessor-controlled laser system capable of broadband tuning capabilities by using multiple tuning elements each with progressively finer linewidth control. U.S. Pat. No. 5,276,695 discloses a tunable laser capable of multiple wavelength emission simultaneously or with a very fast switching time between lines by using a laser crystal in the cavity and fine rotation of the cavity end reflective element. U.S. Pat. No. 5,734,666 discloses a wavelength selection apparatus for a laser diode eliminating mechanical motion of a grating by utilizing a laser resonator for wavelength range selection and a piezoelectric-controlled crystal for specific wavelength selection.

Recent non-patent prior art also discloses relevant technology. In SPIE vol. 2482, pp. 269–274 by Zhongqi, Zhang, et al., a microprocessor-controlled tunable diode laser that utilizes a stepper motor to rotate the grating for wavelength tuning is described. In addition, in SPIE vol. 3098, pp. 374–381 by Uenishi, Akimoto, and Nagoka, a tunable laser diode with an external silicon mirror has been fabricated with MEMS technology and has wavelength tunability.

All of the prior art described above is limited in its performance by one or more of the following: requiring mechanical motion, small wavelength range tunability, or specified or limited line selection order. Especially for applications in spectroscopy, broadband wavelength tuning, arbitrary or simultaneous line selection, and limited or no mechanical motion are desired characteristics.

OBJECTS OF THE INVENTION

Therefore, it is the object of the invention disclosed herein to provide a tunable diode laser with broadband digital line selection capability.

It is also an object of the invention disclosed herein to provide a tunable diode laser with fast, broadband, digital line selection capability in arbitrary order.

It is also an object of the invention disclosed herein to provide a tunable diode laser with fast, broadband, digital line selection capability in arbitrary order that allows discrete switching between a predetermined series of wavelengths.

SUMMARY OF THE INVENTION

The present invention provides an improved tunable diode laser configuration over the prior art. A focusing element, such as a concave mirror or a lens, used in combination with a micromirror array serves as the retroreflector in a typical Littman-Metcalf laser cavity. This configuration provides both arbitrary and simultaneous line selection capability over a very broad wavelength range. The use of individually controllable micromirrors within the micromirror array eliminates the high precision mechanical motion of the grating element and improves the overall durability and ruggedness of the device. The present invention can be universally adapted to any laser diode device. The advantages that the present invention provides over the prior art are particularly significant in various spectroscopic applications.

BRIEF DESCRIPTION OF THE DRAWINGS

The features of the invention believed to be novel are set forth in the associated claims. The invention, however, together with further objects and advantages thereof, may best be understood by reference to the following description taken in conjunction with the accompanying drawings in which:

DETAILED DESCRIPTION

Figure 1:
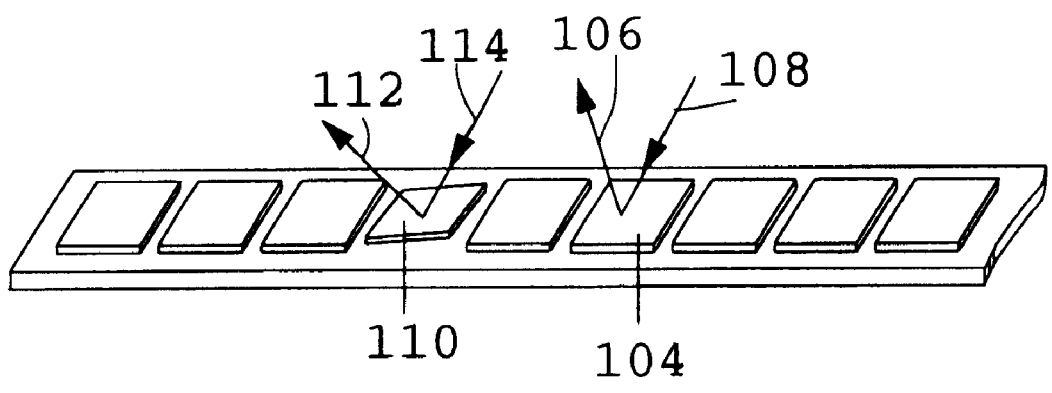
FIG. 1 is an isometric cutaway view of a digital micromirror linear array showing its individual micromirror elements' interaction with incident light in both resting and +/−θ positions.

A primary component of the invention presently described is a digitally controllable micromirror array (MMA). Referring to FIG. 1, the MMA is, for this specific application, a linear array 100 of individually controllable micromirrors (micromirror elements). Alternative micromirror array configurations such as a two dimensional array or other geometric configuration could also be used, however the best mode includes a linear array. A micromirror element in its resting (off) position 104 will provide a normally reflected light wave 106 in response to a first incident light wave 108. Similarly, a deflected micromirror element 110 in either of its +/−θ positions (see discussion of FIGS. 3 and 4 below) will provide a deflected light wave, 112 in response to a second incident light wave, 114.

Figure 2:
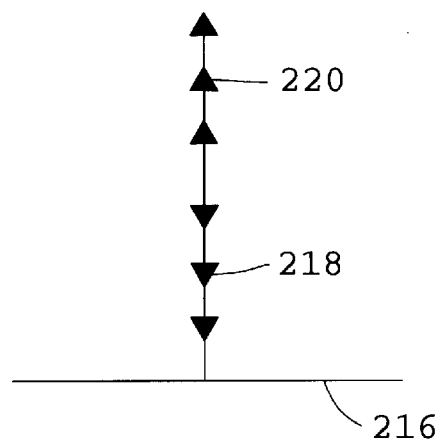
FIG. 2 is a schematic line drawing detailing the propagation of incident light on an individual micromirror array element in its resting (Off) position.

The control and reflection properties of the MMA linear array 100 are further described with reference to FIGS. 2, 3, and 4. FIG. 2 shows a representative micromirror array element 216 in its resting (off) position. A perpendicularly-incident light wave 218 reflects back along the same axis as a perpendicularly reflected light wave 220. This resting (off) position is not utilized once the MMA 100 is powered on to either of its +/−θ positions, and so is shown here solely for reference.

Figure 3:
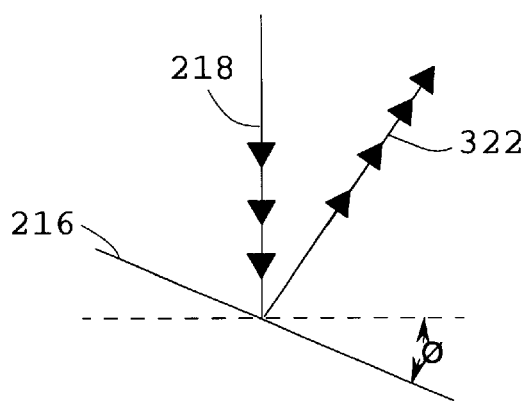
FIG. 3 is a schematic line drawing detailing the propagation of incident light on an individual micromirror array element in its first +θ position.

FIG. 3 shows representative micromirror array element 216 deflected to its first position with a tilt of +θ from its resting position. Perpendicularly incident light wave 218 will reflect in a different direction as a first deflected light wave 322.

Figure 4:
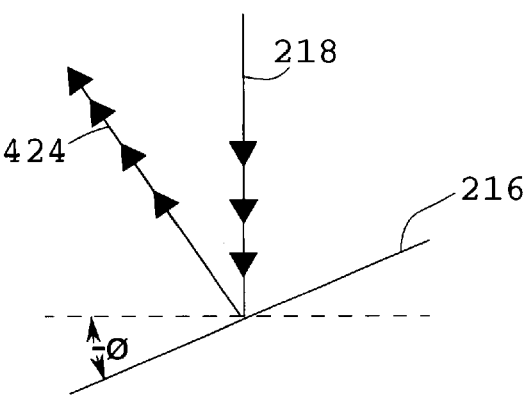
FIG. 4 is a schematic line drawing detailing the propagation of incident light on an individual micromirror array element in its second −θ position.

FIG. 4 shows representative micromirror array element 216 deflected to its second position with a tilt of −θ from its resting position. Perpendicularly incident light wave 218 will reflect in a different direction as a second deflected light wave 424.

Typically, the normal resting state as illustrated by FIG. 2 is not a position used in an optical system design. Most often, the MMA 100 is used in its first position as shown in FIG. 3 or in its second position as shown in FIG. 4. FIG. 2 is shown here for the purpose of comparison and to establish the resting position from which the deflection is measured. In the system configuration presented here, the entire MMA 100 is placed at an angle to the incident light. When the individual micromirrors are in the first position, their tilted plane is normal to the incident light.

The MMA employed for this purpose is a well established in the prior art as a packaged array of individually-controlled micromirrors. The array of micromirrors is formed over an array of individually-addressable electrodes. There are various designs for the micromirror support mechanisms that provide various tilt or deflection directions, any of which is suitable for use in accordance with the invention. Only one will be described here, as a non-limiting illustration of the desired micromirror array functionality.

Each micromirror is supported by at least one hinge device and is controlled by at least one address electrode. There is a definable gap between the address electrode and the micromirror to allow for tilting or deformation of the micromirror. A common configuration is a squared micromirror supported by two hinges at two corners of the micromirror diagonally opposite each other, and controlled by address electrodes at the two remaining corners. Such a dual control system enables the bi-directional tilt or deformation of the micromirror element 216 as shown in FIGS. 3 and 4. The MMA 100 described in detail above is an integral component of the present invention.

Figure 5A:
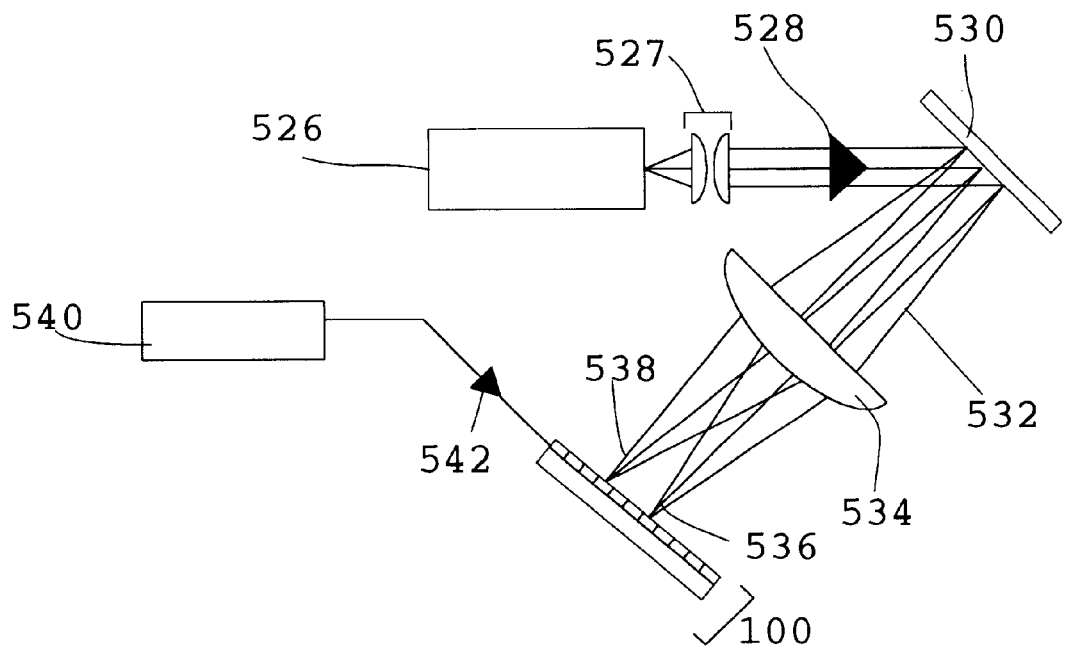
FIGS. 5a and 5b are a schematic view of the entire tunable diode laser system showing both incident and reflective light paths.
Figure 5B:
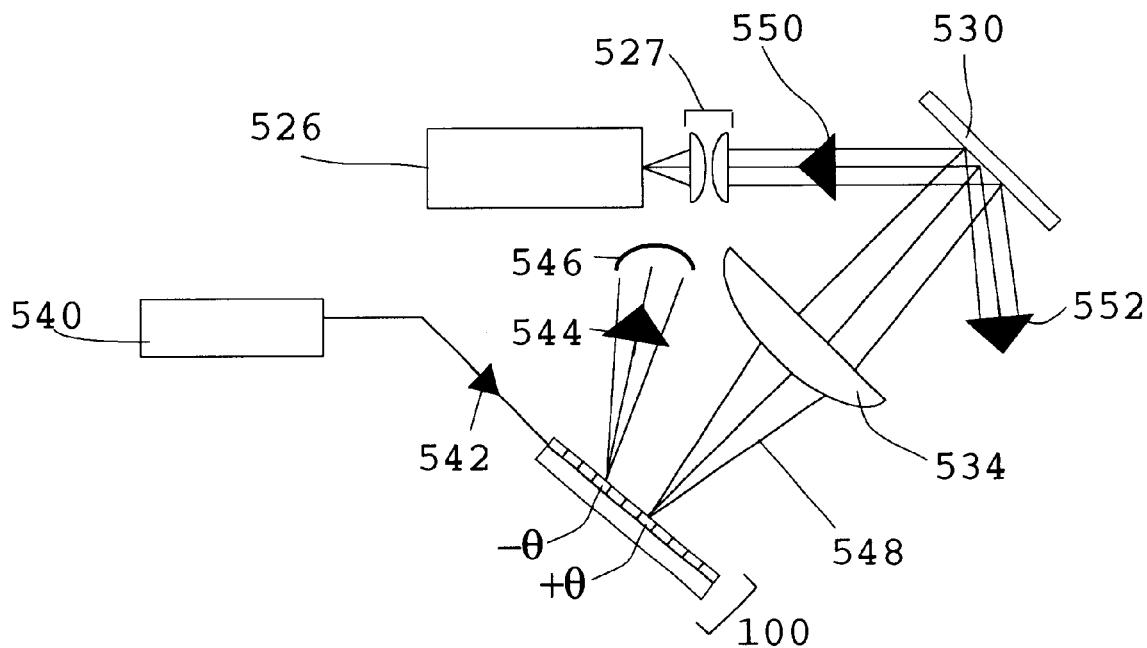

FIG. 5a details the incident path of MMA 100 while FIG. 5b details the reflective path of MMA 100. Referring now to FIG. 5a, a diode laser source 526 emits a set of output light waves 528, over a broad spectrum of wavelengths that is collimated by collimating means 527 such as the illustrated lens set. A diffraction grating 530 is positioned in front of the light wave output 528 of laser diode source 526 and collimating means 527 so as to diffract output light waves 528. The angle of diffraction is dependent on wavelength of light. The majority of the light is diffracted into the first order and diffracted light waves 532 are passed through or reflected from a focusing element 534, such as a lens or a mirror, for example, in order to transform the diffraction angle of diffracted light waves 532 to linear spatial dispersion according to wavelength.

As such, a set of focused light waves of a first wavelength 536 and a set of focused light waves of a second wavelength 538 and so on, are individually brought to points of focus in the same plane but linearly displaced from one another. All wavelengths present in the output light waves 528 of the diode laser source 526 are separated in this manner. Although the total number of wavelengths present can be numerous, only two are shown in the figure for ease of discussion.

The focal plane of focusing element 534, which is also the plane in which the light waves of first and second wavelengths, 536 and 538 respectively, are focused, is where the micromirror array 100 is located. As shown in FIG. 5a, the MMA 100 is slightly tilted in this plane in order to achieve a normal reflection back into the system when the micromirrors are placed in their first position. Each of the separated wavelengths, such as focused light waves of first wavelength and second wavelength, 536 and 538 respectively, is focused on and thus controlled by a single micromirror array element such as 104 in FIG. 1.

As stated, each wavelength is associated with an individual element of the MMA 100. Control module 540 sends a control signal 542 to the MMA 100 setting the configuration of its individual elements to control the selection of wavelengths of the diode laser source 526.

Any representative micromirror array element 216 upon which a wavelength not selected for lasing is focused, is moved into the second (−θ) position, as shown in FIG. 4. Now referring to FIG. 5b, the light 544 reflected from such a −θ micromirror element is deflected away from focusing element 534 and collected by a light trap 546. (Only one such deflecting −θ micromirror element is illustrated here. It is understood that in practice a plurality of such deflections can and do occur.)

In order to select a wavelength for lasing, the representative micromirror array element 216 upon which the desired wavelength is focused, is switched to the first (+θ) position, as represented in FIG. 3. Again referring to FIG. 5b, such a +θ micromirror array element 216 will reflect the selected wavelength light 548 back through focusing element 534 to the diffraction grating 530 and provide selected wavelength input 550 into the laser diode source 526 to promote amplification and thus lasing at that particular wavelength. Once amplified, the laser output 552 is produced along the zeroth order of the diffraction grating 530.

As a reference for the description of the deflection of representative micromirror array element 216 and for a complete understanding of its incorporation into the present invention, the following convention is used. Since the tilting direction of the micromirror array elements 216 is somewhat arbitrary and dependent on the actual laser system layout, the first position will always be defined to represent deflection into the laser cavity. Similarly, the second position will always be defined to represent deflection away from the laser cavity.

Specific wavelengths within the spectral range of the laser diode source 526 can be selected for amplification and laser output by deflecting their associated micromirror array element 216 into the first position. Similarly, specific wavelengths within the spectral range of the laser diode source 526 can be deselected for amplification by deflecting their associated micromirror array element 216 to their second position. This is the most basic system configuration in which the present invention is implemented. The control module 540 would serve as the user interface. Wavelength selection by the user, would be converted by the control module 540 to a specific MMA 100 configuration of deflection into the first and second positions, and a control signal 542 sent to the MMA 100 for implementation.

This basic system implementation can be naturally expanded to allow for amplification of multiple wavelengths at the same time by simultaneously deflecting all micromirror array elements 216 desired for amplification to the first position, and all others to the second position.

Moreover, the present invention can also be configured for fast digital wavelength selection. This system configuration can be implemented through the control module 540 by programming a series of control signals 542 to be sent to the MMA 100 to control and activate selected micromirrors and thus their corresponding wavelengths in a specific sequence. This allows for switching between a selected wavelength or set of wavelengths and the next within the switching time of the micromirror array elements, typically on the order of 20 $\mu$sec.

An alternative embodiment of the present invention utilizes alternative technology to provide the function of the MMA 100 in the present invention. The MMA 100 can be replaced by a combination of a mirror and a mask array with all other system elements remaining the same. The mask array comprises individual mirror mask elements that can each turn on or off selected wavelengths focused on the mirror region behind them by allowing or preventing light from passing through them. Due to the mechanical nature typical of such mask arrays and inherent size limitations, this alternative embodiment is not best suited for laser diode and/or spectroscopic applications, but may become more practical for such use as the technology for mask array mirrors is improved, and so is considered to be within the scope of this invention and its associated claims. Electronic mask arrays, which become transparent under one electronic condition (digital "0" current) and opaque under a second electronic condition (digital "1" current) are also suited to this purpose when coupled with a suitable mirror. Also suitable to replace MMA 100 would be an array of "semi-mirrors" which are reflective under one electronic condition and transparent or opaque (non-reflective) under a second electronic condition. A classic example of this technology is liquid crystals which are used in a wide variety of display applications from computer monitors to digital wristwatches. Liquid crystals in various configurations can be transparent, opaque or reflective as described above.

Similarly, another alternative embodiment of the present invention replaces MMA 100 with a combination of a mirror and a spatial light modulator with all other system elements remaining the same. This configuration would also provide individual mirror elements whose light path could be controlled. As in the alternative embodiment above, this configuration is not best suited for laser diode and spectroscopic applications primarily due to signal loss, but may also become more practical with advances in this technology and so is considered to be within the scope of this invention and its associated claims.

The key point, is that MMA 100, or whatever other device is used as a substitute (equivalent) for MMA 100, must provide the functional ability to selectively reflect back in a given direction, or not reflect back in that given direction, light which impinges upon each localized region of that device. Generically, the MMA 100, and any other suitable device which provides this fundamental functionality, shall be referred to as a "locally-controllable reflectivity array means." The local, selectable reflective elements of such an array (such as the individual micromirrors of MMA 100) will be generically referred to as "localized reflective elements" of that array.

The advantages of the present invention as compared to prior art listed above include the applicability to any wavelength laser diode, no mechanical movement in the preferred embodiment, fast digital laser line selection, arbitrary laser line selection, and multiple laser line selection at once all in one tunable diode laser system.

While only certain preferred features of the invention have been illustrated and described, many modifications, changes and substitutions will occur to those skilled in the art. It is, therefore, to be understood that this disclosure and its associated claims are intended to cover all such modifications and changes as fall within the true spirit of the invention.

We claim:

1. A system for selecting wavelength lines from a monochromatic light source, comprising:

wavelength separation means for separating incoming monochromatic light emitted from said monochromatic light source, into wavelength-separated light comprising a plurality of separate component wavelengths of said incoming monochromatic light;

wavelength focusing means for focusing said separate component wavelengths of said wavelength-separated light into displaced light, wherein each one of said plurality of separate component wavelengths is focused, but is displaced from, all others of said plurality of separate component wavelengths, within a common focal plane of said wavelength focusing means;

locally-controllable reflectivity array means further comprising a plurality of individually-controllable localized reflective elements residing substantially within said common focal plane of said wavelength focusing means, each of said localized reflective elements corresponding to and reflecting one of said plurality of said separate component wavelengths of said displaced light;

control module means for: selecting which of said separate component wavelengths is to be reflected back toward said monochromatic light source; activating each localized reflective element for which the corresponding wavelength is selected for reflection wherein said corresponding selected wavelength is reflected back toward said monochromatic light source; and activating each localized reflective element for which the corresponding wavelength is not selected for reflection wherein said corresponding not-selected wavelength is not reflected back toward said monochromatic light source; and omitting an interferometer for measuring and correcting wavelengths of light reflected back toward said monochromatic light source.

2. The system of claim 1, used for simultaneously selecting a plurality of said wavelength lines; wherein, by means of said control module:

a predetermined plurality of said separate component wavelengths is selected for simultaneous reflection back toward said monochromatic light source;

the localized reflective elements corresponding to said wavelengths so-selected for reflection back toward said monochromatic light source are thereby activated to reflect said corresponding wavelength back toward said monochromatic light source; and the remaining localized reflective elements corresponding to said wavelengths not so-selected for reflection back toward said monochromatic light source are thereby activated to not reflect said corresponding wavelength back toward said monochromatic light source.

3. The system of claim 1, used for sequentially selecting a plurality of said wavelength line sets; wherein, by means of said control module:

a plurality of sets of at least zero of said separate component wavelengths is selected for reflection back toward said monochromatic light source, as sequential selected wavelength line sets;

each one of said sequential selected wavelength line sets is sequentially activated;

the localized reflective elements corresponding to said wavelengths so-selected for reflection back toward said monochromatic light source for whichever one of said sequential wavelength line sets is active at a given moment are thereby activated to reflect said corresponding wavelength back toward said monochromatic light source;

the remaining localized reflective elements corresponding to said wavelengths not so-selected for reflection back toward said monochromatic light source for the one of said wavelength line sets which is active at said given moment are thereby activated to not reflect said corresponding wavelength back toward said monochromatic light source.

4. The system of claim 1, wherein said monochromatic light source comprises a diode laser.

5. The system of claim 4, further comprising amplification means for amplifying said wavelengths so-reflected back toward said monochromatic light source, for lasing at these reflected wavelengths.

6. The system of claim 2, wherein said monochromatic light source comprises a diode laser.

7. The system of claim 6, further comprising amplification means for amplifying said wavelengths so-reflected back toward said monochromatic light source, for lasing at these reflected wavelengths.

8. The system of claim 3, wherein said monochromatic light source comprises a diode laser.

9. The system of claim 8, further comprising amplification means for amplifying said wavelengths so-reflected back toward said monochromatic light source, for lasing at these reflected wavelengths.

10. The system of claim 1, wherein:

said wavelength separation means further comprises diffraction means for diffracting said incoming monochromatic light, thereby producing said wavelength-separated light; and said wavelength focusing means for focusing said wavelength-separated light into said displaced light further comprises a focusing element selected from the focusing element group consisting of lenses and mirrors.

11. The system of claim 1, wherein:

said locally-controllable reflectivity array means comprises micromirror array means;

said plurality of individually-controllable localized reflective elements comprises a plurality of individually-controllable micromirrors;

so-activating each localized reflective element for which the corresponding wavelength is selected for reflection wherein said corresponding selected wavelength is reflected back toward said monochromatic light source comprises maintaining each micromirror for which the corresponding wavelength is selected for reflection in a first +θ position wherein said corresponding selected wavelength is reflected back toward said monochromatic light source; and so-activating each localized reflective element for which the corresponding wavelength is not selected for reflection wherein said corresponding wavelength is not reflected back toward said monochromatic light source comprises moving each micromirror for which the corresponding wavelength is not selected for reflection into a second −θ position wherein said corresponding not-selected wavelength is reflected so as to be deflected away from said monochromatic light source.

12. The system of claim 1, wherein:

said locally-controllable reflectivity array means comprises a mirror and a mask array;

said plurality of individually-controllable localized reflective elements comprises a plurality of individually-controllable mask array elements selectively permitting and masking light from reaching an associated region of said mirror;

so-activating each localized reflective element for which the corresponding wavelength is selected for reflection wherein said corresponding selected wavelength is reflected back toward said monochromatic light source comprises activating each mask array element for which the corresponding wavelength is selected for reflection wherein said corresponding selected wavelength passes through to the associated region of the mirror and is reflected back toward said monochromatic light source; and so-activating each localized reflective element for which the corresponding wavelength is not selected for reflection wherein said corresponding wavelength is not reflected back toward said monochromatic light source comprises activating each mask array element for which the corresponding wavelength is not selected for reflection wherein said corresponding not-selected wavelength is masked from passing through to the associated region of the mirror and is not reflected back toward said monochromatic light source.

13. The system of claim 1, wherein:

said locally-controllable reflectivity array means comprises a mirror and a spatial light modulator;

said plurality of individually-controllable localized reflective elements comprises a plurality of individually-controllable spatial light modulator elements selectively allowing and preventing light to be and from being reflected by an associated region of said mirror back toward and away from said monochromatic light source;

so-activating each localized reflective element for which the corresponding wavelength is selected for reflection wherein said corresponding selected wavelength is reflected back toward said monochromatic light source comprises activating each spatial light modulator element for which the corresponding wavelength is selected for reflection wherein said corresponding selected wavelength is reflected back toward said monochromatic light source; and so-activating each localized reflective element for which the corresponding wavelength is not selected for reflection wherein said corresponding wavelength is not reflected back toward said monochromatic light source comprises activating each spatial light modulator element for which the corresponding wavelength is not selected for reflection wherein said corresponding not-selected wavelength not reflected back toward said monochromatic light source.

14. The system of claim 1, wherein:

said locally-controllable reflectivity array means comprises "semi-mirror" array means;

said plurality of individually-controllable localized reflective elements comprises a plurality of individually-controllable semi-mirror array element means for reflecting light under a first electronic condition and not reflecting light under a second electronic condition;

so-activating each localized reflective element for which the corresponding wavelength is selected for reflection wherein said corresponding selected wavelength is reflected back toward said monochromatic light source comprises generating said first electronic condition for each semi-mirror array element for which the corresponding wavelength is selected for reflection wherein said corresponding selected wavelength is thereby reflected back toward said monochromatic light source; and so-activating each localized reflective element for which the corresponding wavelength is not selected for reflection wherein said corresponding wavelength is not reflected back toward said monochromatic light source comprises generating said second electronic condition for each semi-mirror array element for which the corresponding wavelength is not selected for reflection wherein said corresponding not-selected wavelength is not reflected back toward said monochromatic light source.

15. A system for selecting wavelength lines from a monochromatic light source, comprising:

wavelength separation means for separating incoming monochromatic light emitted from said monochromatic light source, into wavelength-separated light comprising a plurality of separate component wavelengths of said incoming monochromatic light;

wavelength focusing means for focusing said separate component wavelengths of said wavelength-separated light into displaced light, wherein each one of said plurality of separate component wavelengths is focused, but is displaced from, all others of said plurality of separate component wavelengths, within a common focal plane of said wavelength focusing means;

locally-controllable selectivity and reflectivity array means further comprising a plurality of individually-controllable localized coplanar selective and reflective elements residing substantially within said common focal plane of said wavelength focusing means, each of said localized selective and reflective elements corresponding to and selecting and reflecting one of said plurality of said separate component wavelengths of said displaced light; and control module means for: determining which of said separate component wavelengths is to be reflected back toward said monochromatic light source; activating each localized selective and reflective element for which the corresponding wavelength is selected for reflection wherein said corresponding selected wavelength is reflected back toward said monochromatic light source; and activating each localized selective and reflective element for which the corresponding wavelength is not selected for reflection wherein said corresponding not-selected wavelength is not reflected back toward said monochromatic light source; whereby:

because said selective and reflective elements are coplanar, each said selected wavelength is reflected back toward said monochromatic light source substantially perfectly along its direction of incidence, thereby eliminating the need to provide means to correct said selected wavelengths that is required when said wavelengths are not coplanar selected and reflected, and improving accuracy, timing, and power output.

16. The system of claim 15, used for simultaneously selecting a plurality of said wavelength lines; wherein, by means of said control module:

a predetermined plurality of said separate component wavelengths is selected for simultaneous reflection back toward said monochromatic light source;

the localized reflective elements corresponding to said wavelengths so-selected for reflection back toward said monochromatic light source are thereby activated to reflect said corresponding wavelength back toward said monochromatic light source; and the remaining localized reflective elements corresponding to said wavelengths not so-selected for reflection back toward said monochromatic light source are thereby activated to not reflect said corresponding wavelength back toward said monochromatic light source.

17. The system of claim 15, used for sequentially selecting a plurality of said wavelength line sets; wherein, by means of said control module:

a plurality of sets of at least zero of said separate component wavelengths is selected for reflection back toward said monochromatic light source, as sequential selected wavelength line sets;

each one of said sequential selected wavelength line sets is sequentially activated;

the localized reflective elements corresponding to said wavelengths so-selected for reflection back toward said monochromatic light source for whichever one of said sequential wavelength line sets is active at a given moment are thereby activated to reflect said corresponding wavelength back toward said monochromatic light source;

the remaining localized reflective elements corresponding to said wavelengths not so-selected for reflection back toward said monochromatic light source for the one of said wavelength line sets which is active at said given moment are thereby activated to not reflect said corresponding wavelength back toward said monochromatic light source.

18. The system of claim 15, wherein said monochromatic light source comprises a diode laser.

19. The system of claim 18, further comprising amplification means for amplifying said wavelengths so-reflected back toward said monochromatic light source, for lasing at these reflected wavelengths.

20. The system of claim 16, wherein said monochromatic light source comprises a diode laser.

21. The system of claim 20, further comprising amplification means for amplifying said wavelengths so-reflected back toward said monochromatic light source, for lasing at these reflected wavelengths.

22. The system of claim 17, wherein said monochromatic light source comprises a diode laser.

23. The system of claim 22, further comprising amplification means for amplifying said wavelengths so-reflected back toward said monochromatic light source, for lasing at these reflected wavelengths.

24. The system of claim 15, wherein:
said wavelength separation means further comprises diffraction means for diffracting said incoming monochromatic light, thereby producing said wavelength-separated light; and
said wavelength focusing means for focusing said wavelength-separated light into said displaced light further comprises a focusing element selected from the focusing element group consisting of lenses and mirrors.

25. The system of claim 15, wherein:
said locally-controllable reflectivity array means comprises micromirror array means;
said plurality of individually-controllable localized reflective elements comprises a plurality of individually-controllable micromirrors;
so-activating each localized reflective element for which the corresponding wavelength is selected for reflection wherein said corresponding selected wavelength is reflected back toward said monochromatic light source comprises maintaining each micromirror for which the corresponding wavelength is selected for reflection in a first +θ position wherein said corresponding selected wavelength is reflected back toward said monochromatic light source; and
so-activating each localized reflective element for which the corresponding wavelength is not selected for reflection wherein said corresponding wavelength is not reflected back toward said monochromatic light source comprises moving each micromirror for which the corresponding wavelength is not selected for reflection into a second −θ position wherein said corresponding not-selected wavelength is reflected so as to be deflected away from said monochromatic light source.

26. The system of claim 15, wherein:
said locally-controllable reflectivity array means comprises a mirror and a mask array;
said plurality of individually-controllable localized reflective elements comprises a plurality of individually-controllable mask array elements selectively permitting and masking light from reaching an associated region of said mirror;
so-activating each localized reflective element for which the corresponding wavelength is selected for reflection wherein said corresponding selected wavelength is reflected back toward said monochromatic light source comprises activating each mask array element for which the corresponding wavelength is selected for reflection wherein said corresponding selected wavelength passes through to the associated region of the mirror and is reflected back toward said monochromatic light source; and
so-activating each localized reflective element for which the corresponding wavelength is not selected for reflection wherein said corresponding wavelength is not reflected back toward said monochromatic light source comprises activating each mask array element for which the corresponding wavelength is not selected for reflection wherein said corresponding not-selected wavelength is masked from passing through to the associated region of the mirror and is not reflected back toward said monochromatic light source.

27. The system of claim 15, wherein:
said locally-controllable reflectivity array means comprises a mirror and a spatial light modulator;
said plurality of individually-controllable localized reflective elements comprises a plurality of individually-controllable spatial light modulator elements selectively allowing and preventing light to be and from being reflected by an associated region of said mirror back toward and away from said monochromatic light source;
so-activating each localized reflective element for which the corresponding wavelength is selected for reflection wherein said corresponding selected wavelength is reflected back toward said monochromatic light source comprises activating each spatial light modulator element for which the corresponding wavelength is selected for reflection wherein said corresponding selected wavelength is reflected back toward said monochromatic light source; and
so-activating each localized reflective element for which the corresponding wavelength is not selected for reflection wherein said corresponding wavelength is not reflected back toward said monochromatic light source comprises activating each spatial light modulator element for which the corresponding wavelength is not selected for reflection wherein said corresponding not-selected wavelength not reflected back toward said monochromatic light source.

28. The system of claim 15, wherein:
said locally-controllable reflectivity array means comprises "semi-mirror" array means;
said plurality of individually-controllable localized reflective elements comprises a plurality of individually-controllable semi-mirror array element means for reflecting light under a first electronic condition and not reflecting light under a second electronic condition;
so-activating each localized reflective element for which the corresponding wavelength is selected for reflection wherein said corresponding selected wavelength is reflected back toward said monochromatic light source comprises generating said first electronic condition for each semi-mirror array element for which the corresponding wavelength is selected for reflection wherein said corresponding selected wavelength is thereby reflected back toward said monochromatic light source; and
so-activating each localized reflective element for which the corresponding wavelength is not selected for reflection wherein said corresponding wavelength is not reflected back toward said monochromatic light source comprises generating said second electronic condition for each semi-mirror array element for which the corresponding wavelength is not selected for reflection wherein said corresponding not-selected wavelength is not reflected back toward said monochromatic light source.

29. A system for selecting wavelength lines from a monochromatic light source, comprising:

wavelength separation means for separating incoming monochromatic light emitted from said monochromatic light source, into wavelength-separated light comprising a plurality of separate component wavelengths of said incoming monochromatic light;

wavelength focusing means for focusing said separate component wavelengths of said wavelength-separated light into displaced light, wherein each one of said plurality of separate component wavelengths is focused, but is displaced from, all others of said plurality of separate component wavelengths, within a common focal plane of said wavelength focusing means;

locally-controllable reflectivity array means further comprising a plurality of individually-controllable localized reflective elements residing substantially within said common focal plane of said wavelength focusing means, each of said localized reflective elements corresponding to and reflecting one of said plurality of said separate component wavelengths of said displaced light; and control module means for: selecting which of said separate component wavelengths is to be reflected back toward said monochromatic light source; activating each localized reflective element for which the corresponding wavelength is selected for reflection wherein said corresponding selected wavelength is reflected back toward said monochromatic light source; and activating each localized reflective element for which the corresponding wavelength is not selected for reflection wherein said corresponding not-selected wavelength is not reflected back toward said monochromatic light source; wherein:

said locally-controllable reflectivity array means comprises micromirror array means;

said plurality of individually-controllable localized reflective elements comprises a plurality of individually-controllable micromirrors;

so-activating each localized reflective element for which the corresponding wavelength is selected for reflection wherein said corresponding selected wavelength is reflected back toward said monochromatic light source comprises maintaining each micromirror for which the corresponding wavelength is selected for reflection in a first +θ position wherein said corresponding selected wavelength is reflected back toward said monochromatic light source; and so-activating each localized reflective element for which the corresponding wavelength is not selected for reflection wherein said corresponding wavelength is not reflected back toward said monochromatic light source comprises moving each micromirror for which the corresponding wavelength is not selected for reflection into a second −θ position wherein said corresponding not-selected wavelength is reflected so as to be deflected away from said monochromatic light source; whereby:

because a said micromirror array means inherently selects and reflects said wavelengths in a common spatial plane, each said selected wavelength is inherently reflected back toward said monochromatic light source substantially perfectly along its direction of incidence, thereby eliminating the need to provide means to correct said selected wavelengths that is required when said wavelengths are not coplanar selected and reflected, and improving accuracy, timing, and power output.

30. A method for selecting wavelength lines from a monochromatic light source, comprising the steps of:

separating incoming monochromatic light emitted from said monochromatic light source, into wavelength-separated light comprising a plurality of separate component wavelengths of said incoming monochromatic light, using wavelength separation means;

focusing said separate component wavelengths of said wavelength-separated light into displaced light, wherein each one of said plurality of separate component wavelengths is focused, but is displaced from, all others of said plurality of separate component wavelengths, using wavelength focusing means, within a common focal plane of said wavelength focusing means;

reflecting each one of said plurality of said separate component wavelengths of said displaced light off of a corresponding individually-controllable localized reflective element of a locally-controllable reflectivity array means residing substantially within said common focal plane of said wavelength focusing means;

selecting which of said separate component wavelengths is to be reflected back toward said monochromatic light source; activating each localized reflective element for which the corresponding wavelength is selected for reflection wherein said corresponding selected wavelength is reflected back toward said monochromatic light source; and activating each localized reflective element for which the corresponding wavelength is not selected for reflection wherein said corresponding not-selected wavelength is not reflected back toward said monochromatic light source; using control module means; and omitting a step of measuring and correcting wavelengths of light reflected back toward said monochromatic light source using an interferometer.

31. The method of claim 30, used for simultaneously selecting a plurality of said wavelength lines; further comprising the steps, using said control module, of:

selecting a predetermined plurality of said separate component wavelengths for simultaneous reflection back toward said monochromatic light source;

thereby so-activating the localized reflective elements corresponding to said wavelengths so-selected for reflection back toward said monochromatic light source to reflect said corresponding wavelength back toward said monochromatic light source; and thereby so-activating the remaining localized reflective elements corresponding to said wavelengths not so-selected for reflection back toward said monochromatic light source to not reflect said corresponding wavelength back toward said monochromatic light source.

32. The method of claim 30, used for sequentially selecting a plurality of said wavelength line sets; further comprising the steps, using said control module, of:

selecting a plurality of sets of at least zero of said separate component wavelengths for reflection back toward said monochromatic light source, as sequential selected wavelength line sets;

sequentially activating each one of said sequential selected wavelength line sets;

so-activating to reflect said corresponding wavelength back toward said monochromatic light source, the localized reflective elements corresponding to said wavelengths so-selected for reflection back toward said monochromatic light source for whichever one of said sequential wavelength line sets is active at a given moment;

so-activating to not reflect said corresponding wavelength back toward said monochromatic light source, the remaining localized reflective elements corresponding to said wavelengths not so-selected for reflection back toward said monochromatic light source for the one of said wavelength line sets which is active at said given moment.

33. The method of claim 30, said monochromatic light source comprising a diode laser.

34. The method of claim 33, further comprising the step of amplifying said wavelengths so-reflected back toward said monochromatic light source, for lasing at these reflected wavelengths, using amplification means.

35. The method of claim 31, said monochromatic light source comprising a diode laser.

36. The method of claim 35, further comprising the step of amplifying said wavelengths so-reflected back toward said monochromatic light source, for lasing at these reflected wavelengths, using amplification means.

37. The method of claim 32, wherein said monochromatic light source comprising a diode laser.

38. The method of claim 37, further comprising the step of amplifying said wavelengths so-reflected back toward said monochromatic light source, for lasing at these reflected wavelengths, using amplification means.

39. The method of claim 30:

the step of so-separating said incoming monochromatic light into said wavelength-separated light comprises using diffraction means for diffracting said incoming monochromatic light, thereby producing said wavelength-separated light; and the step of so-focusing said separate component wavelengths of said wavelength-separated light into said displaced light comprises using a focusing element selected from the focusing element group consisting of lenses and mirrors.

40. The method of claim 30:

said locally-controllable reflectivity array means comprising micromirror array means;

said plurality of individually-controllable localized reflective elements comprising a plurality of individually-controllable micromirrors;

the step of so-activating each localized reflective element for which the corresponding wavelength is selected for reflection wherein said corresponding selected wavelength is reflected back toward said monochromatic light source comprising maintaining each micromirror for which the corresponding wavelength is selected for reflection in a first +θ position wherein said corresponding selected wavelength is reflected back toward said monochromatic light source; and the step of so-activating each localized reflective element for which the corresponding wavelength is not selected for reflection wherein said corresponding wavelength is not reflected back toward said monochromatic light source comprising moving each micromirror for which the corresponding wavelength is not selected for reflection into a second −θ position wherein said corresponding not-selected wavelength is reflected so as to be deflected away from said monochromatic light source.

41. The method of claim 30:

said locally-controllable reflectivity array means comprising a mirror and a mask array;

said plurality of individually-controllable localized reflective elements comprising a plurality of individually-controllable mask array elements selectively permitting and masking light from reaching an associated region of said mirror;

the step of so-activating each localized reflective element for which the corresponding wavelength is selected for reflection wherein said corresponding selected wavelength is reflected back toward said monochromatic light source comprising activating each mask array element for which the corresponding wavelength is selected for reflection wherein said corresponding selected wavelength passes through to the associated region of the mirror and is reflected back toward said monochromatic light source; and the step of so-activating each localized reflective element for which the corresponding wavelength is not selected for reflection wherein said corresponding wavelength is not reflected back toward said monochromatic light source comprising activating each mask array element for which the corresponding wavelength is not selected for reflection wherein said corresponding not-selected selected wavelength is masked from passing through to the associated region of the mirror and is not reflected back toward said monochromatic light source.

42. The method of claim 30:

said locally-controllable reflectivity array means comprising a mirror and a spatial light modulator;

said plurality of individually-controllable localized reflective elements comprising a plurality of individually-controllable spatial light modulator elements selectively allowing and preventing light to be and from being reflected by an associated region of said mirror back toward and away from said monochromatic light source;

the step of so-activating each localized reflective element for which the corresponding wavelength is selected for reflection wherein said corresponding selected wavelength is reflected back toward said monochromatic light source comprises activating each spatial light modulator element for which the corresponding wavelength is selected for reflection wherein said corresponding selected wavelength is reflected back toward said monochromatic light source; and the step of so-activating each localized reflective element for which the corresponding wavelength is not selected for reflection wherein said corresponding wavelength is not reflected back toward said monochromatic light source comprises activating each spatial light modulator element for which the corresponding wavelength is not selected for reflection wherein said corresponding not-selected wavelength not reflected back toward said monochromatic light source.

43. The method of claim 30:

said locally-controllable reflectivity array means comprising "semi-mirror" array means;

said plurality of individually-controllable localized reflective elements comprising a plurality of individually-controllable semi-mirror array element means for reflecting light under a first electronic condition and not reflecting light under a second electronic condition;

the step of so-activating each localized reflective element for which the corresponding wavelength is selected for reflection wherein said corresponding selected wavelength is reflected back toward said monochromatic light source comprises generating said first electronic condition for each semi-mirror array element for which the corresponding wavelength is selected for reflection wherein said corresponding selected wavelength is thereby reflected back toward said monochromatic light source; and the step of so-activating each localized reflective element for which the corresponding wavelength is not selected for reflection wherein said corresponding wavelength is not reflected back toward said monochromatic light source comprises generating said second electronic condition for each semi-mirror array element for which the corresponding wavelength is not selected for reflection wherein said corresponding not-selected wavelength is not reflected back toward said monochromatic light source.

44. A method for selecting wavelength lines from a monochromatic light source, comprising the steps of:

displacing away from one another, a plurality of separate component wavelengths of incoming monochromatic light emitted from said monochromatic light source;

selecting which of said plurality of said separate component wavelengths is to be reflected back toward said monochromatic light source;

reflecting each separate component wavelength selected for reflection back toward said monochromatic light source; and reflecting each separate component wavelength not selected for reflection so as to be deflected away from said monochromatic light source; and omitting a step of measuring and correcting wavelengths of light reflected back toward said monochromatic light source using an interferometer.

45. A method for selecting wavelength lines from a monochromatic light source, comprising the steps of:

displacing away from one another, a plurality of separate component wavelengths of incoming monochromatic light emitted from said monochromatic light source;

selecting which of said plurality of said separate component wavelengths is to be reflected back toward said monochromatic light source;

reflecting each separate component wavelength selected for reflection back toward said monochromatic light source spatially coplanar with said step of selecting; and reflecting each separate component wavelength not selected for reflection so as to be deflected away from said monochromatic light source; whereby:

because said selecting and reflecting steps are coplanar, each said selected wavelength is reflected back toward said monochromatic light source substantially perfectly along its direction of incidence, thereby eliminating the need to provide means to correct said selected wavelengths that is required when said wavelengths are not coplanar selected and reflected, and improving accuracy, timing, and power output.

46. A method for selecting wavelength lines from a monochromatic light source, comprising the steps of:

separating incoming monochromatic light emitted from said monochromatic light source, into wavelength-separated light comprising a plurality of separate component wavelengths of said incoming monochromatic light, using wavelength separation means;

focusing said separate component wavelengths of said wavelength-separated light into displaced light, wherein each one of said plurality of separate component wavelengths is focused, but is displaced from, all others of said plurality of separate component wavelengths, using wavelength focusing means, within a common focal plane of said wavelength focusing means;

selecting and reflecting each one of said plurality of said separate component wavelengths of said displaced light off of a corresponding individually-controllable localized coplanar selective and reflective element of a locally-controllable selectivity and reflectivity array means residing substantially within said common focal plane of said wavelength focusing means; and determining which of said separate component wavelengths is to be reflected back toward said monochromatic light source; activating each localized selective and reflective element for which the corresponding wavelength is selected for reflection wherein said corresponding selected wavelength is reflected back toward said monochromatic light source; and activating each localized selective and reflective element for which the corresponding wavelength is not selected for reflection wherein said corresponding not-selected wavelength is not reflected back toward said monochromatic light source; using control module means; whereby:

because said selecting and reflecting steps are coplanar, each said selected wavelength is reflected back toward said monochromatic light source substantially perfectly along its direction of incidence, thereby eliminating the need to provide means to correct said selected wavelengths that is required when said wavelengths are not coplanar selected and reflected, and improving accuracy, timing, and power output.

47. The method of claim 46, used for simultaneously selecting a plurality of said wavelength lines; further comprising the steps, using said control module, of:

selecting a predetermined plurality of said separate component wavelengths for simultaneous reflection back toward said monochromatic light source;

thereby so-activating the localized reflective elements corresponding to said wavelengths so-selected for reflection back toward said monochromatic light source to reflect said corresponding wavelength back toward said monochromatic light source; and thereby so-activating the remaining localized reflective elements corresponding to said wavelengths not so-selected for reflection back toward said monochromatic light source to not reflect said corresponding wavelength back toward said monochromatic light source.

48. The method of claim 46, used for sequentially selecting a plurality of said wavelength line sets; further comprising the steps, using said control module, of:

selecting a plurality of sets of at least zero of said separate component wavelengths for reflection back toward said monochromatic light source, as sequential selected wavelength line sets;

sequentially activating each one of said sequential selected wavelength line sets;

so-activating to reflect said corresponding wavelength back toward said monochromatic light source, the localized reflective elements corresponding to said wavelengths so-selected for reflection back toward said monochromatic light source for whichever one of said sequential wavelength line sets is active at a given moment;

so-activating to not reflect said corresponding wavelength back toward said monochromatic light source, the remaining localized reflective elements corresponding to said wavelengths not so-selected for reflection back toward said monochromatic light source for the one of said wavelength line sets which is active at said given moment.

49. The method of claim 46, said monochromatic light source comprising a diode laser.

50. The method of claim 49, further comprising the step of amplifying said wavelengths so-reflected back toward said monochromatic light source, for lasing at these reflected wavelengths, using amplification means.

51. The method of claim 47, said monochromatic light source comprising a diode laser.

52. The method of claim 51, further comprising the step of amplifying said wavelengths so-reflected back toward said monochromatic light source, for lasing at these reflected wavelengths, using amplification means.

53. The method of claim 48, wherein said monochromatic light source comprising a diode laser.

54. The method of claim 53, further comprising the step of amplifying said wavelengths so-reflected back toward said monochromatic light source, for lasing at these reflected wavelengths, using amplification means.

55. The method of claim 46:

the step of so-separating said incoming monochromatic light into said wavelength-separated light comprises using diffraction means for diffracting said incoming monochromatic light, thereby producing said wavelength-separated light; and the step of so-focusing said separate component wavelengths of said wavelength-separated light into said displaced light comprises using a focusing element selected from the focusing element group consisting of lenses and mirrors.

56. The method of claim 46:

said locally-controllable reflectivity array means comprising micromirror array means;

said plurality of individually-controllable localized reflective elements comprising a plurality of individually-controllable micromirrors;

the step of so-activating each localized reflective element for which the corresponding wavelength is selected for reflection wherein said corresponding selected wavelength is reflected back toward said monochromatic light source comprising maintaining each micromirror for which the corresponding wavelength is selected for reflection in a first +θ position wherein said corresponding selected wavelength is reflected back toward said monochromatic light source; and the step of so-activating each localized reflective element for which the corresponding wavelength is not selected for reflection wherein said corresponding wavelength is not reflected back toward said monochromatic light source comprising moving each micromirror for which the corresponding wavelength is not selected for reflection into a second −θ position wherein said corresponding not-selected wavelength is reflected so as to be deflected away from said monochromatic light source.

57. The method of claim 46:

said locally-controllable reflectivity array means comprising a mirror and a mask array;

said plurality of individually-controllable localized reflective elements comprising a plurality of individually-controllable mask array elements selectively permitting and masking light from reaching an associated region of said mirror;

the step of so-activating each localized reflective element for which the corresponding wavelength is selected for reflection wherein said corresponding selected wavelength is reflected back toward said monochromatic light source comprising activating each mask array element for which the corresponding wavelength is selected for reflection wherein said corresponding selected wavelength passes through to the associated region of the mirror and is reflected back toward said monochromatic light source; and the step of so-activating each localized reflective element for which the corresponding wavelength is not selected for reflection wherein said corresponding wavelength is not reflected back toward said monochromatic light source comprising activating each mask array element for which the corresponding wavelength is not selected for reflection wherein said corresponding not-selected wavelength is masked from passing through to the associated region of the mirror and is not reflected back toward said monochromatic light source.

58. The method of claim 46:

said locally-controllable reflectivity array means comprising a mirror and a spatial light modulator;

said plurality of individually-controllable localized reflective elements comprising a plurality of individually-controllable spatial light modulator elements selectively allowing and preventing light to be and from being reflected by an associated region of said mirror back toward and away from said monochromatic light source;

the step of so-activating each localized reflective element for which the corresponding wavelength is selected for reflection wherein said corresponding selected wavelength is reflected back toward said monochromatic light source comprises activating each spatial light modulator element for which the corresponding wavelength is selected for reflection wherein said corresponding selected wavelength is reflected back toward said monochromatic light source; and the step of so-activating each localized reflective element for which the corresponding wavelength is not selected for reflection wherein said corresponding wavelength is not reflected back toward said monochromatic light source comprises activating each spatial light modulator element for which the corresponding wavelength is not selected for reflection wherein said corresponding not-selected wavelength not reflected back toward said monochromatic light source.

59. The method of claim 46:

said locally-controllable reflectivity array means comprising "semi-mirror" array means;

said plurality of individually-controllable localized reflective elements comprising a plurality of individually-controllable semi-mirror array element means for reflecting light under a first electronic condition and not reflecting light under a second electronic condition;

the step of so-activating each localized reflective element for which the corresponding wavelength is selected for reflection wherein said corresponding selected wavelength is reflected back toward said monochromatic light source comprises generating said first electronic condition for each semi-mirror array element for which the corresponding wavelength is selected for reflection wherein said corresponding selected wavelength is thereby reflected back toward said monochromatic light source; and the step of so-activating each localized reflective element for which the corresponding wavelength is not selected for reflection wherein said corresponding wavelength is not reflected back toward said monochromatic light source comprises generating said second electronic condition for each semi-mirror array element for which the corresponding wavelength is not selected for reflection wherein said corresponding not-selected wavelength is not reflected back toward said monochromatic light source.

60. A method for selecting wavelength lines from a monochromatic light source, comprising the steps of:

separating incoming monochromatic light emitted from said monochromatic light source, into wavelength-separated light comprising a plurality of separate component wavelengths of said incoming monochromatic light, using wavelength separation means;

focusing said separate component wavelengths of said wavelength-separated light into displaced light, wherein each one of said plurality of separate component wavelengths is focused, but is displaced from, all others of said plurality of separate component wavelengths, using wavelength focusing means, within a common focal plane of said wavelength focusing means;

reflecting each one of said plurality of said separate component wavelengths of said displaced light off of a corresponding individually-controllable localized reflective element of a locally-controllable reflectivity array means residing substantially within said common focal plane of said wavelength focusing means; and selecting which of said separate component wavelengths is to be reflected back toward said monochromatic light source; activating each localized reflective element for which the corresponding wavelength is selected for reflection wherein said corresponding selected wavelength is reflected back toward said monochromatic light source; and activating each localized reflective element for which the corresponding wavelength is not selected for reflection wherein said corresponding not-selected wavelength is not reflected back toward said monochromatic light source; using control module means; further:

said locally-controllable reflectivity array means comprising micromirror array means;

said plurality of individually-controllable localized reflective elements comprising a plurality of individually-controllable micromirrors;

the step of so-activating each localized reflective element for which the corresponding wavelength is selected for reflection wherein said corresponding selected wavelength is reflected back toward said monochromatic light source comprising maintaining each micromirror for which the corresponding wavelength is selected for reflection in a first $+\theta$ position wherein said corresponding selected wavelength is reflected back toward said monochromatic light source; and the step of so-activating each localized reflective element for which the corresponding wavelength is not selected for reflection wherein said corresponding wavelength is not reflected back toward said monochromatic light source comprising moving each micromirror for which the corresponding wavelength is not selected for reflection into a second $-\theta$ position wherein said corresponding not-selected wavelength is reflected so as to be deflected away from said monochromatic light source; whereby:

because a said micromirror array means inherently selects and reflects said wavelengths in a common spatial plane, each said selected wavelength is inherently reflected back toward said monochromatic light source substantially perfectly along its direction of incidence, thereby eliminating the need to provide means to correct said selected wavelengths that is required when said wavelengths are not coplanar selected and reflected, and improving accuracy, timing, and power output.

* * * * *